CLOCKED R-S FLIP-FLOP
Filed Sept. 13, 1966
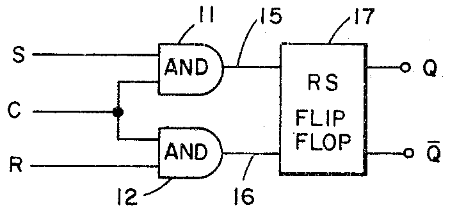
Fig.1
(Prior Art)
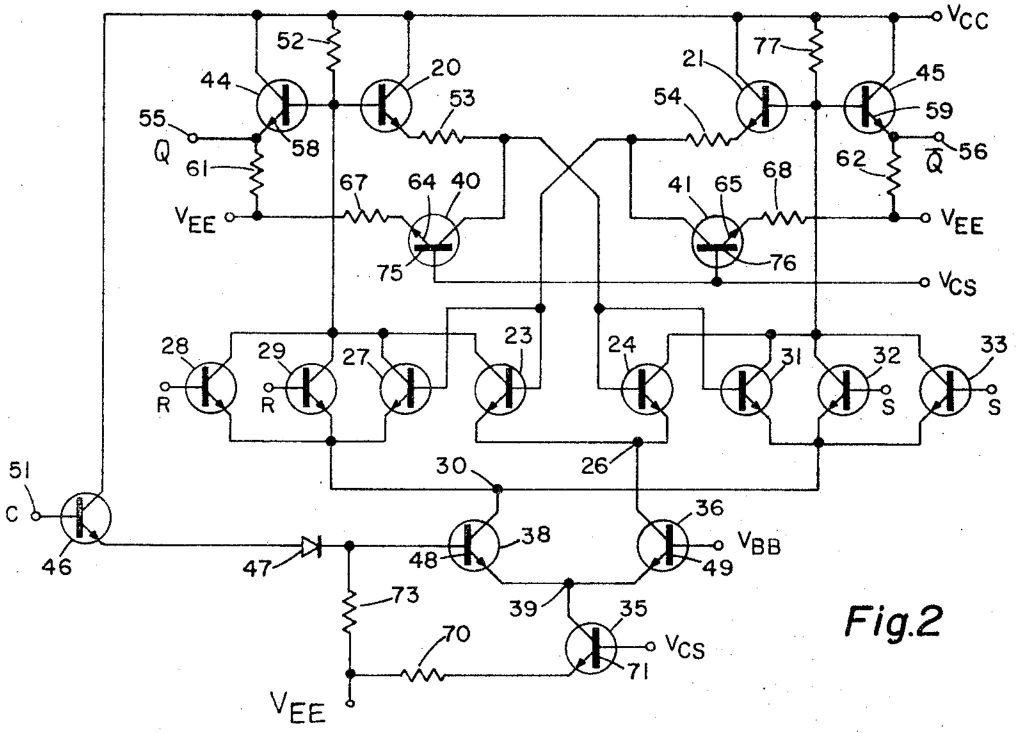
Fig.2
TRUTH TABLE OF A CLOCKED RS FF
| LINE | $R_n$ | $S_n$ | $C_n$ | $Q_{n+1}$ |
|---|---|---|---|---|
| 1 | 0 | 0 | 0 | $Q_n$ |
| 2 | 1 | 0 | 0 | $Q_n$ |
| 3 | 0 | 1 | 0 | $Q_n$ |
| 4 | 1 | 1 | 0 | $Q_n$ |
| 5 | 0 | 0 | 1 | $Q_n$ |
| 6 | 1 | 0 | 1 | 0 |
| 7 | 0 | 1 | 1 | 1 |
| 8 | 1 | 1 | 1 | Undetermined |
Fig.3
INVENTORS
Ury Priel
Walter C. Seelbach
BY
Mueller, Aichele & Rauner
ATTY'S.

United States Patent Office 3,424,928
Patented Jan. 28, 1969

3,424,928

CLOCKED R-S FLIP-FLOP

Ury Priel, Phoenix, and Walter C. Seelbach, Scottsdale, Ariz., assignors to Motorola, Inc., Franklin Park, Ill., a corporation of Illinois Filed Sept. 13, 1966, Ser. No. 584,039
U.S. Cl. 307—291 11 Claims
Int. Cl. H03k 3/26

This invention relates generally to current mode emitter-coupled logic circuits and more particularly to a clocked SET-RESET (R-S) flip-flop which includes a novel series-parallel clocking circuit. This clocking circuit imparts to the R-S flip-flop a clocked capability and yet is constructed with a minimum number of integrated circuit components and consumes a minimum of power while operating with a minimum switching delay time.

Presently known flip-flop circuits which are designed for clocked operation require that a source of clock signals be "anded" to the R-S binary information applied to the flip-flop in order to give the flip-flop a clocked capability. Such a prior art clocked flip-flop is illustrated in FIG. 1 of the accompanying drawing. The invention to be described herein eliminates the requirement for this type of AND gate input connection.

Accordingly, it is an object of this invention to provide a new and improved emitter-coupled flip-flop having a clocked capability and constructed with a minimum number of integrated circuit components.

Another object of this invention is to provide a new and improved current mode R-S flip-flop which will operate with a minimum of switching delay and power dissipation.

Another object of this invention is to provide a clocked R-S flip-flop which lends itself to the ease of integrated circuit construction and which does not require a common emitter bias resistor for the holding or latch-back transistors of the flip-flop. Such a bias resistor was required in copending application Ser. No. 363,959 of Narud et al., assigned to the assignee of this invention.

A feature of this invention is the provision of a new series-parallel, differentially connected current switch which may be connected to or integrally formed with a transistorized R-S flip-flop. The flip-flop may, for example, include a pair of emitter-follower or level shifting transistors cross-coupled in a symmetrical circuit configuration to a first pair of holding or latch-back transistors. The series-parallel current switch includes a reference transistor to which a reference voltage is applied and a clocking transistor to which is coupled a source of clock signals. The relative voltage levels of the clock signals and the reference voltage will control the clocked operation of the R-S flip-flop.

Another feature of this invention is the provision of an additional or second pair of latch-back or holding transistors. The emitters of this additional pair of holding transistors are coupled to the emitters of input set and reset transistors and in turn connected to the collector of the clocking transistor. These alternate holding transistors insure that the flip-flop will remain in its existing conductive state when clock signals enable the flip-flop for set-reset operation and a change in conductive state of the flip-flop is not initiated by set and reset signals applied to the set and reset input transistors.

These and other objects and features of the invention will become more fully apparent in the following description of the accompanying drawing wherein:

FIG. 1 is a block diagram representation of a known prior art clocked R-S flip-flop;

FIG. 2 is a schematic diagram of the R-S flip-flop according to this invention; and FIG. 3 is a truth table which is explanatory of the clocked operation of the R-S flip-flop in FIG. 2.

Briefly, the clocked R-S flip-flop according to this invention includes first and second level shifting transistors cross-coupled respectively to second and first holding transistors in a symmetrical circuit configuration which is biased for bistable switching operation. Third and fourth holding transistors are connected to the first and second holding transistors respectively, and may be further connected (emitter-coupled) to as many set and reset input transistors as necessary; the first and second holding transistors are emitter-coupled at a first current output point and the third and fourth holding transistors are emitter-coupled at a second current output point. A series-parallel, differentially connected current mode switch is connected to the R-S flip-flop and includes a reference transistor connected to a reference voltage and a clocking transistor coupled to a source of clock signals. The reference and clocking transistors are connected respectively to the first and second current output points. Depending upon the relative levels of the reference voltage and the clock signals, either one of the first and second holding transistors or one of the third and fourth holding transistors will provide a conductive path within the R-S flip-flop; if one of the third and fourth holding transistors is conducting, the flip-flop may be set and reset by set and reset input signals appied to the set and reset transistors.

Referring in somewhat more detail to the drawing, there is shown in FIG. 1 a block diagram of a prior art clocked R-S flip-flop in which the clock signals C are "anded" to the set and reset signals S and R by a pair of AND gates 11 and 12, and the AND gate outputs are applied via lines 15 and 16 to a SET-RESET bistable flip-flop element 17. As mentioned above, the requirement for the two discrete AND gates 11 and 12 shown in the prior art diagram of FIG. 1 has been eliminated in accordance with the teachings of the present invention. This AND gate connection is not required for the clocked operation of the invention to be described below with reference to the schematic diagram of FIG. 2.

Before describing the clocked operation of the R–S flip-flop in FIG. 2, the component transistors therein will be referenced in accordance with the respective functions they perform in the circuit; these functions will be explained in further detail in the "Description of Operation." The flip-flop in FIG. 2 includes a basic bistable switching element consisting of first and second level shifting transistors 20 and 21 symmetrically cross-coupled respectively to second and first holding transistors 23 and 24, with the holding transistors 23 and 24 connected to a first current output point 26. On the reset side of the flip-flop, a third holding transistor 27 is connected in parallel with reset transistors 28 and 29, with the emitters of transistors 27, 28 and 29 connected to a second current output point 30. Similarly, on the set side of the flip-flop, a fourth holding transistor 31 is connected in parallel with set transistors 32 and 33, also having their emitters connected to a second current output point 30.

A differential clocking arrangement is provided between a current sink transistor 35 and the first and second current output points 26 and 30. This arrangement includes a reference transistor 36 connected between the first current output point 26 and the current sink transistor 35 and a clocking transistor 38 connected between the second current output point 30 and the current sink transistor 35; the clocking and reference transistors 38 and 36 are emitter-coupled at a third current output point 39 which is common to the first and second current output points 26 and 30, respectively.

First and second current source transistors 40 and 41 are internally connected as shown to provide a quasi-fixed reference potential at the base electrodes of the first, second, third and fourth holding transistors. First and second output transistors 44 and 45 are connected as shown to the base electrodes of the first and second level shifting transistors 20 and 21 and to the collectors of the reset and set transistor clusters respectively. This connection provides shifted emitter-follower outputs which are compatible with the inputs. Clock signals are applied to an input transistor 46 and are coupled through diode 47 to the base electrode of the clocking transistor 38, and a base bias resistor 73 connects base electrode 48 to the $V_{EE}$ reference potential.

DESCRIPTION OF OPERATION

The level of voltage at base electrode 48 of clocking transistor 38 with respect to the reference voltage $V_{BB}$ at the base electrode 49 of reference transistor 36 will control the current path in the R–S flip-flop. That is, if the level of the reference voltage $V_{BB}$ is higher than the level of the voltage at the base 48 of the clocking transistor 38, then the reference transistor 36 will conduct and transistor 38 will be non-conductive. The conduction of transistor 36 allows current to flow from the first current output point 26 into the collector of the reference transistor 36, out of the third current output point 39 and into the collector of the current sink transistor 35. Under these conditions, the conductive state of the bistable element of the flip-flop will determine whether the first or the second holding transistor 23 or 24 conducts. Assuming that Q is at a logical ONE level and $\overline{Q}$ is at a logical ZERO level, then the voltage level at the base of the first level shifting transistor 20 will be "high," the second holding transistor 24 will be conducting and the first holding transistor 23 will be nonconducting. This is true because the base of 24 is higher than the base of 23. Under these conditions, no current can flow in the set transistors 32, 33, the reset transistors 28, 29, or the third and fourth holding transistors 27 and 31.

Assume now that clock signals are applied to the C terminal 51 at the base of the input transistor 46, driving the base 48 of clocking transistor 38 to a voltage level which will override the reference voltage $V_{BB}$ and enable current to flow in the set and and reset transistors of the third and fourth holding transistors and into the collector of the clocking transistor 38. In the absence of any set or reset signals applied to the bases of the respective set and reset transistors, one of the third and fourth holding transistors 27 or 31 will conduct and maintain the flip-flop in its previous state. For the conditions assumed above and with the second holding transistor 24 previously conducting, the fourth holding transistor 31 will take over and current will flow from the fourth holding transistor 31 into the clocking transistor 38. If binary logic set signals are now applied to set transistors 32 and 33, then the state of the flip-flop will remain unchanged when conduction is initiated in transistors 32 or 33. As one or both of set transistors 32 and 33 conduct, the fourth holding transistor 31 will be turned off when the level of set input signals exceeds the internal bias level at the base of the fourth holding transistor 31. However, when the set signals drop to a logical ZERO again and the set transistors 32 and 33 turn off, then the fourth holding transistor will again take over and maintain the flip-flop in its previous conductive SET state where Q is at the logical ONE level.

If, however, reset signals are applied to the reset transistors 28 or 29 when the clock is "high," then either transistor 28 or transistor 29 will override the fourth holding transistor 31, pulling the base potential of the first level shifting transistor 20 down and initiating a change of conductive state in the flip-flop. When the reset signals are removed, the third holding transistor 27 will take over since its base is now "high" and this transistor will provide a current path through resistor 52 into the clocking transistor 38 as long as the clock is "high" and overrides the reference voltage $V_{BB}$. If now the clock goes "low," then the first holding transistor 23 will take over, current will flow from the first current output point 26 and the flip-flop will remain in its RESET state.

The reset transistors 28 and 29 are connected in parallel and in turn, they are connected in series with transistor 38 to generate the OR/AND function. Similarly, the OR/AND function is also obtained on the set side of the flip-flop. Using positive logic, binary signals applied to any one of the parallel connected reset transistors will be sufficient to initiate a change in the conductive state of the flip-flop as long as the clocking transistor 38 is conducting.

One outstanding feature of this invention is the connection of the third and fourth holding transistors 27 and 31 in the manner described above so that these holding transistors are able to take over and maintain the flip-flop in its previous conductive state when the clock goes "high" and no set or reset signals are applied to the set and reset transistors 28, 29 and 32, 33.

First and second resistors 53 and 54 are connected between the emitters of the first and second level shifting transistors, respectively, and the base electrodes of the second and fourth and the first and third holding transistors. These resistors establish a base potential at these holding transistors which may be overridden by set and reset signals applied to the set and reset transistors and yet bias one of the holding transistors conducting in the absence of set and reset input signals. Previous schemes to establish a desired voltage level at the holding transistors utilized a common emitter resistor for the holding transistors such as is disclosed in the above-mentioned copending Narud et al. application, and this connection adds undesirable parasitic capacitance at the common emitter nodes of current output points 26 and 30. The elimination of a resistor at these nodes in the inventive circuit described above by the use of internal cross-coupling resistors 53 and 54 greatly enhances the AC performance of the clocked R-S flip-flop and improves integrated circuit yields due to improved processing tolerances.

The Q and $\overline{Q}$ output terminals 55 and 56 are connected to the emitters 58 and 59 of the output transistors 44 and 45, respectively, and the emitters 58 and 59 of the first and second output transistors 44 and 45 are terminated by resistors 61 and 62 to a power supply $V_{EE}$. Similarly, the emitters 64 and 65 of the current source transistors 41 and 45 are terminated at 67 and 68 to a power supply $V_{EE}$. The value of resistors 67 and 68 determines the current through resistors 53 and 54 and this value fixes the bias at the bases of transistors 23 and 24, respectively. In some instances, it may be desirable to omit transistors 40 and 41. Bases 75 and 76 are connected together at a source of base potential $V_{CS}$.

The current sink transistor 35 is coupled via resistor 70 to a power supply. This transistor is biased at its base electrode 71 by a current source potential $V_{CS}$, and sinks a constant current from the third current output terminal 39 regardless of whether the reference transistor 36 or the clocking transistor 38 is conducting. This current is determined by the voltage $V_{CS}$, the resistor 70 and $V_{EE}$. This constant current sink insures that the output levels of the flip-flop will remain the same for a "high" or "low" clock.

The AND functions provided by the discrete AND gates 11 and 12 in the prior art diagram of FIG. 1 are present in the novel flip-flop circuit of FIG. 2 since the clock and the set or reset signals must be "high" or at a logical ONE level in order to change this state of the flip-flop. The series-paralleled current switching scheme described above provides this capability at no extra power.

FIG. 3 illustrates the truth table for the clocked R-S flip-flop in FIG. 2, and this table lists the $Q_{n+1}$ output condition (level) for eight possible input signal conditions. The input signal conditions listed in lines 1–8 are given in terms of $R_n$, $S_n$ and $C_n$ which represent respectively the binary levels for the reset, set and clock signals at time bit *n*. For the first four signal input conditions (lines 1–4) with the clock $C_n$ at a logical ZERO level, there can be no changes in the conductive state of the flip-flop and the output level for $Q_{n+1}$ (at time bit $n+1$) will remain in its previous state of $Q_n$. For condition five (line 5), with $R_n$ and $S_n$ at a logical ZERO level and $C_n=1$, there is still no change in the conductive state of the flip-flop. However, when $C_n$ is at a logical ONE level in conditions six and seven (lines 6 and 7) and is "anded" respectively to the reset signals and set signals at a binary ONE level, there will be a change of state for $Q_{n+1}$ to a binary ZERO logical level at condition 6 and then to a binary ONE logical level at condition 7.

For the eighth condition given where $R_n$, $S_n$, $C_n$ are all at a binary ONE level, the state of the flip-flop output $Q_{n+1}$ will be undetermined. This is true for all SET-RESET flip-flops.

The following table of resistor values and voltage levels illustrates those used in one R-S flip-flop actually built and successfully tested in accordance with the teachings of this invention. However, these values should in no way be construed as limiting the scope of this invention.

*Table of values*

| Resistor No.: | Ohms |
|---|---|
| 52 | 100 |
| 53 | 160 |
| 54 | 160 |
| 61 | 600 |
| 62 | 600 |
| 67 | 244 |
| 68 | 244 |
| 70 | 50 |
| 73 | 800 |
| 77 | 100 |

| Voltage: | Volts |
|---|---|
| $V_{EE}$ | −5.2 |
| $V_{CS}$ | −3.92 |
| $V_{BB}$ | −2.82 |
| $V_{CC}$ | .0 |

There are many additional and alternative connections which may be made to the circuit shown in FIG. 2 without departing from the spirit and scope of this invention. For example, some extensions of the basic connection shown in FIG. 2 will result in a multichannel flip-flop having three or more pairs of holding or latch-back transistors. In one such extension of FIG. 2 designed and successfully tested, three pairs of holding transistors were used and an additional or second clocking transistor was emitter-coupled to the first clocking transistor. In this particular arrangement the first pair of holding transistors was connected to the collector of the reference transistor and the second pair of holding transistors was emitter-coupled to the set and reset input transistors and to the collector of the first clocking transistor as shown in FIG. 2. To this arrangement was added a third pair of holding transistors which was connected to an additional or second cluster of set and reset input transistors. This third pair of holding transistors was emitter-coupled to the collector of the second clocking transistor to give two independent channels for selectively setting and resetting the flip-flop.

Accordingly, it should be understood that the invention described herein above is limited only by way of the following appended claims.

We claim:

1. In a SET-RESET flip-flop having first and second level shifting transistor means cross-coupled to first and second holding transistor means, set and reset transistor means connected respectively to the first and second level shifting transistor means and connected in parallel respectively with said first and second holding transistor means, and means for biasing one of the first and second holding transistor means nonconducting when the flip-flop is in one of its two stable states, the improvement comprising:

(a) a third holding transistor means connected to said first holding transistor means and connected in parallel with said set transistor means, (b) a fourth holding transistor means connected to said second holding transistor means and connected in parallel with said reset transistor means, said first and second holding transistor means connected to a first current output point and said third and fourth holding transistor means connected to a second current output point, (c) a reference transistor connected between said first current output point and a reference voltage and providing a current path from one of said first and second holding transistors when said flip-flop is in one of its two stable states, and (d) a clocking transistor means connected between said second current output point and said reference transistor means at a third current output point, said clocking transistor means connectable to a source of clock transitions for providing a current path from said flip-flop at said second current output point when said clock transitions reach a predetermined voltage level with respect to said reference voltage.

2. The flip-flop according to claim 1 wherein:

(a) said reference transistor means and said clocking transistor means are connected to said third current output point in a differential connection in which either said reference transistor or said clocking transistor means is conducting, and (b) a current sink connected between said third current output point and a point of reference potential.

3. The flip-flop according to claim 1 which further includes:

(a) a first resistance means connected between said first level shifting transistor means and said second holding transistor means, (b) a second resistor means connected between said second level shifting transistor means and said first holding transistor means, (c) a first current source connected to said first resistance means for establishing a stable biasing potential thereat, and (d) a second current source connected to said second resistance means for establishing a quasi-fixed reference potential thereat.

4. The flip-flop according to claim 3 which further includes input transistor means connected to said clock transistor means and connectable to a source of clock signals at a level sufficiently high to initiate conduction in said input transistor means and thereby initiate conduction in said clocking transistor means for enabling said flip-flop for set-reset operation.

5. A bistable multivibrator having SET and RESET conductible states and including in combination:

(a) first and second level shifting transistors each having an emitter, a base and a collector and first and second holding transistors each having an emitter, a base and a collector, the emitters of said first and second holding transistors connected to a first current output point, means cross-coupling the emitter of said first level shifting transistor to the base of said second holding transistor and further connecting said emitter of said second level shifting transistor to said base of said first holding transistor, (b) a third holding transistor having an emitter, a base and a collector, said third holding transistor connected to said first holding transistor, (c) a fourth holding transistor having an emitter, a base and a collector, said fourth holding transistor connected to said second holding transistor, said third and fourth holding transistors connected to a second current output point, (d) a reset transistor having an emitter, a base and a collector, said reset transistor connected in parallel with said third holding transistor, (e) a set transistor having an emitter, a base and a collector, said set transistor connected in parallel with said fourth holding transistor, said set and reset transistors connected to receive set and reset binary logic signals for changing the conductive state of said flip-flop, (f) a reference transistor having an emitter, a base and a collector, said reference transistor connected between said first common current output point and a reference voltage supply terminal, and (g) a clocking transistor having an emitter, a base and a collector, said clocking transistor connected between said second current output point and a source of clock transitions, said clocking and reference transistors differentially connected together at a third current output point whereby said reference transistor and said clocking transistor are alternately biased into conduction when clock transitions are periodically applied to said clocking transistor and reach a predetermined voltage level with respect to the voltage level at said voltage supply terminal.

6. The flip-flop according to claim 5 wherein:

(a) said means cross-coupling said first and second level shifting transistors to said first and second holding transistors includes first and second resistance means connecting the emitters of said first and second level shifting transistors to the bases of said second and first holding transistors respectively, (b) first and second current sources connected to the bases of said first and second holding transistors for eestablishing a stable biasing potential thereat, (c) a current sink transistor connected between said third current output point and a point of reference potential for providing a common output current path for said reference and clocking transistors, and (d) an input transistor connected across a supply voltage and to said clocking transistor for coupling clock transitions to said clocking transistor to bias said clocking transistor into conduction and to enable set and reset signals applied to said set and reset signals applied to said set and reset transistors to change the conductive state of the flip-flop after reaching a predetermined logical level with respect to the voltage level at the bases of said first and second holding transistors.

7. The flip-flop according to claim 6 wherein:

(a) said third holding transistor and said first holding transistor have their collector-base paths connected in parallel and said second holding transistor and said fourth holding transistor have their collector-base paths connected in parallel, (b) said emitters of said first and second holding transistors connected to the collector of said reference transistor at said first current output point and said emitters of said third and fourth holding transistors connected to the collector of said clocking transistor at said second current output point, the application of clock transitions to said clocking transistor at a level sufficiently high to bias said clocking transistor into conduction will enable conduction in either said third or said fourth holding transistor thereby holding said flip-flop in its previous conductive state in the absence of set and reset signals applied to said set and reset transistors.

8. The flip-flop according to claim 7 which further includes first and second output transistors connected to said first and second level shifting transistors for providing binary output signals during the clocked operation of said flip-flop.

9. The flip-flop according to claim 7 wherein:

(a) said reset and set transistors are connected with their emitter-collector paths in parallel respectively with the emitter-collector paths of said third and fourth holding transistors and are further connected to receive binary logic reset and set signals at the bases thereof, (b) said collectors of said first and third holding transistors and said collector of said reset transistor connected to the base of said first level shifting transistor, (c) said collectors of said second fourth holding transistors and said collector of said set transistor connected to the base of said second level shifting transistor, (d) a first bias resistor connected between said base of said first level shifting transistor and a point of collector potential, (e) a second bias resistor connected between said base of said second level shifting transistor and said point of collector potential, and (f) said collectors of said first and second level shifting transistors connected to said point of collector potential.

10. The flip-flop according to claim 9 wherein:

(a) said first and second current sources include respectively first and second current source transistors each having an emitter, a base and a collector with the collectors thereof connected respectively to the bases of said first and second holding transistors and with the emitters thereof resistively connected to a voltage supply terminal, said bases of said first and second current source transistors connected to a point of base potential, (b) said first and second output transistors each having an emitter, a base and a collector with the collectors thereof connected to said point of collector potential, said bases of said first and second output transistors connected respectively to the bases of said first and second level shifting transistors, and said emitters of said first and second output transistors resistively connected to a point of emitter potential, and (c) means for deriving an output signal from the emitters of said first and second output transistors.

11. The flip-flop according to claim 10 which further includes:

(a) a diode connected to the emitter of said input transistor, (b) an emitter resistor connected between said diode and said point of reference potential, and (c) means connecting the common junction of said diode and said emitter resistor to the base of said clocking transistor.

References Cited

UNITED STATES PATENTS 3,307,047 2/1967 Narud et al. ---------- 307—247

ARTHUR GAUSS, *Primary Examiner.*

J. D. FREW, *Assistant Examiner.*

U.S. Cl. X.R.

307—247, 289,